Figure 1:
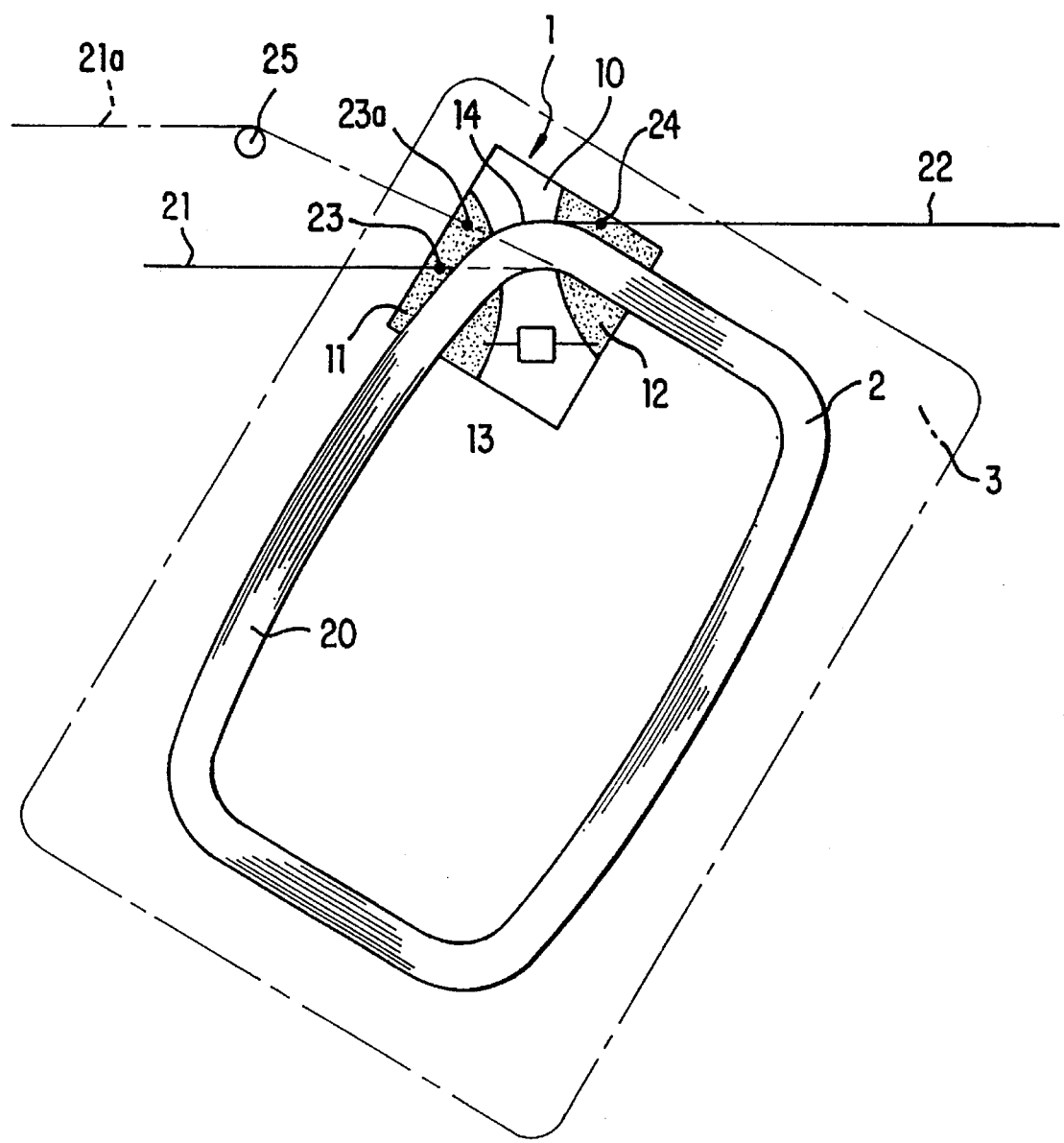

US005606488A

United States Patent [19]
Gustafson

[11] Patent Number: 5,606,488
[45] Date of Patent: Feb. 25, 1997

[54] MINIATURIZED PRINTED CIRCUIT AND COIL ASSEMBLY

[75] Inventor: Ake Gustafson, Chatel St-Denis, Switzerland

[73] Assignee: Sokymat SA, Granges, Switzerland

[21] Appl. No.: 948,587

[22] Filed: Sep. 23, 1992

Related U.S. Application Data

[63] Continuation-in-part of PCT/EP91/00672, Apr. 9, 1992.

[30] Foreign Application Priority Data

Apr. 19, 1990 [CH] Switzerland .............................. 1329/90

[51] Int. Cl.⁶ ................................ H05K 7/06; H05K 7/02
[52] U.S. Cl. ......................... 361/782; 235/487; 235/492;
336/198; 336/200; 336/208; 336/221; 361/737;
361/760
[58] Field of Search ..................... 340/573, 825,
340/825.31, 825.32; 342/51, 572, 573;
235/487, 488, 492, 380, 382, 493, 494;
361/760, 728, 733, 743, 745, 767, 772,
779, 807, 808, 809, 813, 684, 737, 748,
761, 763, 777, 782, 811, 821; 336/198,
200, 208, 221; 333/24 R, 246, 247; 343/744,
866, 868, 867, 872, 873, 895; 379/91, 112;
156/53

[56] References Cited

U.S. PATENT DOCUMENTS

| | | | |
|---|---|---|---|
| 3,956,751 | 5/1976 | Herman | 343/744 |
| 4,035,695 | 7/1977 | Knutson et al. | 336/200 |
| 4,074,227 | 2/1978 | Kalmus | 340/825.3 |
| 4,506,238 | 3/1985 | Endoh et al. | 361/821 |
| 4,560,983 | 10/1950 | Inoue | 235/492 |
| 4,758,322 | 1/1989 | Bernstein et al. | 235/487 |
| 4,818,855 | 4/1989 | Mongeon et al. | 235/492 |
| 4,822,990 | 4/1989 | Tamada et al. | 235/492 |
| 4,947,180 | 8/1990 | Schotz | 343/744 |
| 4,960,983 | 10/1990 | Inoue | 235/492 |
| 4,992,794 | 2/1991 | Brouwers | 342/51 |
| 4,999,742 | 3/1991 | Stampfli | 361/749 |
| 5,025,550 | 1/1991 | Zirbes et al. | 29/605 |
| 5,050,292 | 9/1991 | Zirbes et al. | 361/813 |
| 5,281,855 | 1/1994 | Hadden et al. | 257/784 |
| 5,321,240 | 6/1994 | Takahira | 235/380 |
| 5,337,063 | 8/1994 | Takahira | 343/895 |
| 5,393,001 | 2/1995 | Gustafson | 242/7.14 |

FOREIGN PATENT DOCUMENTS

| | | | |
|---|---|---|---|
| 0079047 | 5/1983 | European Pat. Off. | 235/487 |
| 1050118 | 1/1954 | France | 336/208 |
| 0150315 | 6/1955 | Germany | 336/198 |
| 3721822 | 11/1988 | Germany | 235/492 |
| 1437333 | 5/1976 | United Kingdom | 336/198 |
| WO92/22827 | 12/1992 | WIPO . | |
| WO9320537 | 10/1993 | WIPO | 235/492 |

*Primary Examiner*—Donald A. Sparks
*Attorney, Agent, or Firm*—Oliff & Berridge

[57] ABSTRACT

The process for assembly of a coil with or without a core on a printed circuit comprises placing the printed circuit in the winding machine before starting the winding. When the Flyer brings the wire for the winding, it causes the latter to pass over a metallized path of the printed circuit while keeping said wire taut. After the Flyer has effected the number of turns necessary for the winding, it will carry the wire along, passing onto a second metallized path, always keeping it taut. The soldering of the two end wires of the winding on the respective metallized paths will take place very easily since each of said wires is held taut at the location where the soldering is to take place. This process permits automating the production of miniaturized electronic circuits comprising a winding.

12 Claims, 3 Drawing Sheets

MINIATURIZED PRINTED CIRCUIT AND COIL ASSEMBLY

This is a Continuation-in-Part application of PCT/EP91/00672, filed Apr. 9, 1992.

The miniaturization of electronic circuits entails the necessity of finding new and original solutions for the assembly and connection of the miniaturized components, in particular when it is necessary to join the end wires of a coil to a printed circuit further including one or more discrete components, as well as one or more integrated circuits.

Such circuits including a coil are to be found in particular in numerous applications in which there is transmission and/or reception of an electromagnetic radio frequency signal; among these applications, there may be cited the so-called "intelligent" credit card, as well as wireless search or detection apparatus.

One of the problems connected with the fabrication of such circuits comes from the very small diameter of the wire used for the coil, thus making it very difficult to seize end wires of the coil having to be brought to and soldered on the respective paths of a printed circuit. Moreover, automatic and high-speed mass production of these circuits, in order to reduce their production cost, requires putting in new means for assembling the coil on the printed circuit.

For this purpose, a process has been developed, permitting assembly of a coil on a printed circuit, in a single operation, directly on a winding machine comprising a Flyer (a description of which is presented in U.S. patent applications Ser. No. 07/656,137, filed Mar. 1, 1991 now U.S. Pat. No. 5,261,615, to Cuttelod and Ser. No. 07/833,370 filed Feb. 10, 1992 now U.S. Pat. No. 5,393,001 and PCT/EP92/00363 to Gustafson, fully incorporated herein by reference), and including the steps mentioned in the characterizing clause of claim 1 when there is an air-core coil, and of claim 2 when there is a coil with a core.

Figure 2:
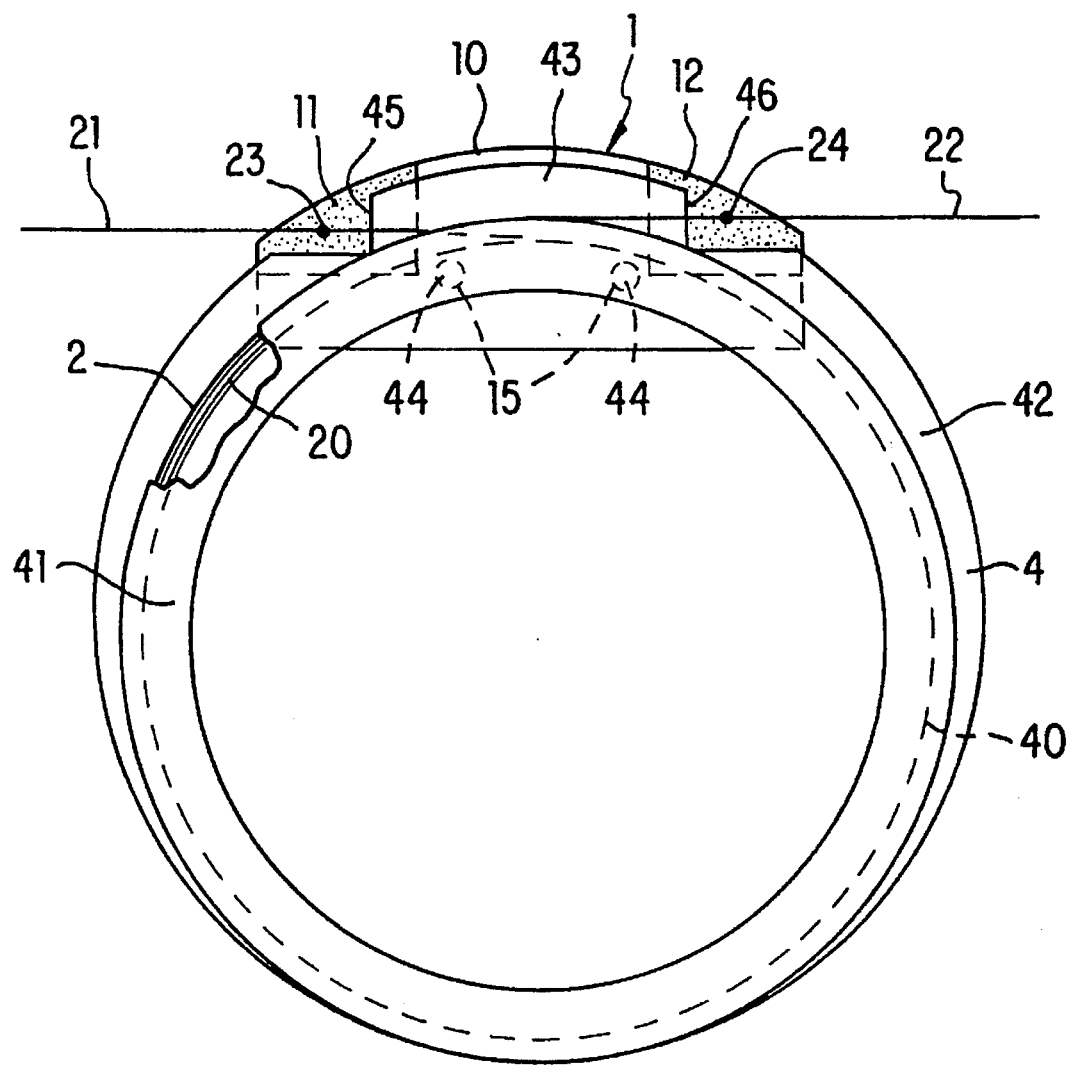
Figure 3:
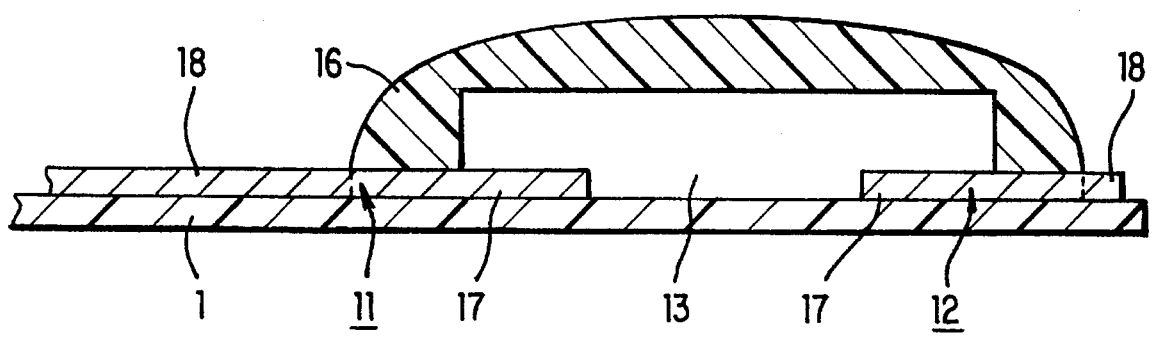

The principle and the details of the assembly process according to the invention are explained starting from the appended drawing with the figures in which:

FIG. 1 represents a plan view of an air-core coil in the process of being assembled with a printed circuit, FIG. 2 represents a plan view of a coil comprising a core, in the process of being assembled with a printed circuit; and FIG. 3 is a partial cross-sectional view of the printed circuit and the electronic element.

In FIG. 1, there is first of all a printed circuit 1 composed of a thin insulating support 10 (on the order of tenths of a mm thick), comprising in particular two metallized paths 11 and 12. One or more discrete miniaturized components, as well as one or more integrated circuits, all symbolized in the figure by the element 13, are connected to the two conductor paths 11 and 12. As shown in FIG. 3, the element 13, which can comprise one or more discrete miniaturized components and/or one or more integrated circuits, is encased or encapsulated with a material 16, which also encapsulates at least the first portions 17 of the printed circuit 1. The second portion 18 of the printed circuit 1 are not encapsulated by the material 16. This printed circuit 1 is first of all put in place on the winding machine (not shown). For forming the winding 2, made up of a wire 20 of very small diameter (a few hundredths of a mm), the winding head, i.e., the Flyer, brings the winding-wire end 21, still connected to the previously wound coil (not shown), into position for winding the winding 2; for this purpose, the wire end 21 remains taut and passes directly above the metallized path 11, winding taking place on a form (not shown) in order to give the coil 2 the required shape. After the Flyer has effected the number of revolutions corresponding to the number of turns necessary on the coil, it will leave the winding position, carrying along the winding-wire end 22, causing it to pass directly above the metallized path 12 and leading it toward the next coil to be wound (not shown), always keeping the wire end 22 taut. There is thus an assembly, held on the machine, which it now suffices to cause to stick together by disposing gluing means on the insulating portion 14 of the printed circuit 1 and by automatically soldering the winding-wire end 21 to the conductor path 11 at the joint 23 and the winding-wire end 22 to the conductor path 12 at the joint 24. It is then possible to cut or tear the winding-wire end 21 before the joint 23, then the winding-wire end 22 after the joint 24, this after the following winding has been terminated, in order to have an air-core coil 2 assembled permanently on a printed circuit. It will then remain to complete the mounting of possible additional components and to encapsulate the winding and the circuit between two layers of plastic to constitute, for example, a so-called "intelligent" credit card 3.

In case, for a topological reason or for any other reason, it is not advantageous that the winding-wire end 21 does not arrive in a straight line from the preceding winding, it is quite possible to modify the angle of arrival of the winding-wire end 21a at the printed circuit in order to choose another location of the metallized path 11 where the joint 23a will be made. For this purpose, the support holding the printed circuit comprises a fixed guide point 25 above which the Flyer passes, in order to guide the winding end wire 21a suitably. This situation is depicted in dot-dash lines in the figure; it is quite obvious that it may also apply to the choice of another location for the soldering of the joint 24 of the winding end wire 22.

Some of the elements previously mentioned are to be found again in FIG. 2, viz., a printed circuit 1 made up of a thin insulating support 10 and comprising two conductor paths 11 and 12. A coil core 4 of synthetic material is made up of a cylindrical barrel, represented by the broken line 40, of a front flange 41, concentric with the barrel 40, and of a rear flange 42, eccentric relative to the barrel 40 and to the front flange 41. The coil 2 of fine wire 20 will be wound in the space situated between the outside surface of the barrel 40 and the two inner faces of the front and rear flanges 41, 42. The rear flange 42 is eccentric in order to present a support surface 43 on which the printed circuit 1 will rest, held by two projections 44 of the core 4, co-operating with two holes 15 pierced in the support 10 of the printed circuit 1 in order to hold these two elements together. The two projections or pins 44 are provided on the outer surface of the rear flange 42. The rear flange 42 further has two notches 45 and 46 which face the two conductor paths 11 and 12 of the printed circuit 1. Thus, when the printed circuit 1 has been put in place on the winding machine, when the core 4 has been superimposed on it and fixed by means of the projections 44 and the holes 15, the Flyer (not shown) will be able to bring the wire end 21 in the same way as previously and to start the winding over the barrel 40 by having passed the wire 21 immediately above the conductor path 11. When the number of turns necessary have been wound, the Flyer will carry the end wire 22 along toward the next coil to be wound, passing immediately above the conductor path 12; as previously, the joints 23 and 24 fix the end wires 21 and 22 on the respective conductor paths 11 and 12. After cutting or tearing of the free end wires before and after the joints 23 and 24, and withdrawal of the unit made up of a coil 2 on a core 4 assembled with a printed circuit 1, there is a fixed assembly which can be integrated in an electronic circuit. As previously, other components or integrated circuits (not shown) could already have been fixed to the printed circuit before its assembly with the coil. It is also possible to modify the angle of arrival or departure of the wires 21 and 22 by disposing one or two guide points, which permits the locations where the soldering will take place to be suitably chosen.

Different variants in the processes described above may be mentioned, all of which enter within the scope of the protection offered by the claims; in particular, the fixing of the discrete components and/or of the integrated circuit or circuits on the printed circuit may take place either before the printed circuit is assembled with the coil, or after this operation; likewise, the fixing of the core on the printed circuit may take place before or after having put the latter on the winding machine. For the operation of soldering the winding-wire ends on the conductor paths, it is important that said wire ends be held and kept taut in some way before carrying out the soldering, it is the only way of being able really to make the production of such circuits more efficient since it is then not necessary to search for one or two extremely fine winding-wire ends, a hazardous, difficult, and long, therefore expensive, operation.

Thus, by carrying out the soldering of the end wires of the winding on the respective metallized paths of the printed circuit, while they are still held in one way or another in the winding machine, it is possible, by this process, to obtain increased productivity in the manufacture of miniaturized electronic circuits including a winding; moreover, the processes described permit the production of extremely thin circuits seeing that the total thickness of the circuit is made up only of the thickness of the coil on which a thickness of the printed circuit is superimposed, itself consisting of a very thin sheet. These advantageous qualities are obtained through the fact that the end wires of the winding are soldered on the paths disposed outside of the winding, whereas the other elements of the electronic circuit, or the integrated circuit, respectively, are lodged in the space situated in the center of the coil, said space being of a sufficient dimension, or thickness, to receive these other circuit elements.

I claim:

1. A miniaturized transponder device, comprising:

a printed circuit board having two metallized surfaces;

at least one electronic component physically attached to the printed circuit board and electrically connected to first portions of the metallized surfaces; and a coil of wire physically attached to the printed circuit board so that second portions of the metallized surfaces extend beyond an outer lateral side of the coil and a portion of the coil is positioned laterally away from the printed circuit board, wherein both ends of the coil of wire remain beyond the outer lateral side of the coil after winding of the coil and in close proximity to the corresponding second portions of the metallized surfaces after winding of the coil and assembly of the coil to the printed circuit board, the ends of the coil of wire being securely electrically connected to said second portions of the metallized surfaces beyond the outer lateral side of the coil before the coil is separated from the wire.

2. The miniaturized transponder device of claim 1, wherein the wire is approximately one hundred microns in diameter or less.

3. The miniaturized transponder device of claim 1, wherein the transponder device is incorporated into an intelligent credit card.

4. The miniaturized transponder device of claim 1, further comprising material encapsulating at least the electronic component and said first portions of the metallized paths with the second portions of the metallized paths protruding therefrom.

5. The miniaturized transponder device of claim 1, wherein the coil is formed from a wire positioned adjacent to the printed circuit board as the coil is wound, at least one end of the wire remaining in close proximity to a corresponding one of the second portions of the metallized paths during winding of the coil.

6. A miniaturized transponder device, comprising:

a printed circuit having two metallized paths;

at least one electronic component physically attached to the printed circuit and electrically connected to first portions of the metallized paths;

a coil of wire physically attached to the printed circuit, ends of the wire being electrically connected to second portions of the metallized paths; and a core formed of synthetic material and comprising a cylindrical barrel, a front flange formed on a first end of the barrel and a rear flange formed on a second end of the barrel, the wire being wound on the barrel;

wherein the second portions of the metallized paths extend to an outer lateral side of the barrel and a portion of the barrel is positioned laterally away from the printed circuit, the ends of the wire being securely electrically connected to said second portions of the metallized paths on the outer lateral side of the barrel before the coil is separated from the wire.

7. The miniaturized transponder device of claim 6, wherein the front flange is concentric to the cylindrical barrel, and the rear flange is eccentric to the cylindrical barrel and the front flange.

8. The miniaturized transponder device of claim 6, wherein the rear flange of the core is physically attached to the printed circuit.

9. The miniaturized transponder device of claim 6, further comprising material encapsulating at least the electronic component and said first portions of the metallized paths with the second portions of the metallized paths protruding therefrom.

10. A miniaturized transponder device, comprising:

a printed circuit having two metallized paths;

at least one electronic component physically attached to the printed circuit and electrically connected to first portions of the metallized paths;

a coil of wire physically attached to the printed circuit, ends of the wire being electrically connected to second portions of the metallized paths; and a core formed of synthetic material and comprising a cylindrical barrel, a front flange formed on a first end of the barrel and a rear flange formed on a second end of the barrel, the wire being wound on the barrel and the rear flange of the core being physically attached to the printed circuit;

wherein the core further comprises a pair of notches provided in the rear flange, such that when the rear flange is attached to the printed circuit, the pair of metallized paths remain accessible for attaching the wire ends thereto.

11. The miniaturized transponder device of claim 10, wherein the core further comprises a plurality of pins provided on an outer surface of the rear flange, and the printed circuit further comprises a plurality of holes formed in said second portions of the metallized paths, the core being physically attached to the printed circuit by inserting the plurality of pins into the plurality of holes.

12. The miniaturized transponder device of claim 10, further comprising material encapsulating at least the electronic component and said first portions of the metallized paths with the second portions of the metallized paths protruding therefrom.

* * * * *